Aug. 12, 1958 H. A. TOULMIN, JR 2,847,330

METHOD AND APPARATUS FOR GAS PLATING PRINTING CIRCUITS

Filed July 28, 1954 3 Sheets-Sheet 1

INVENTOR

HARRY A. TOULMIN JR

BY Toulmin & Toulmin

ATTORNEYS

Aug. 12, 1958 H. A. TOULMIN, JR 2,847,330

METHOD AND APPARATUS FOR GAS PLATING PRINTING CIRCUITS

Filed July 28, 1954 3 Sheets-Sheet 2

INVENTOR
HARRY A. TOULMIN JR

BY Toulmin & Toulmin

ATTORNEYS

METHOD AND APPARATUS FOR GAS PLATING PRINTING CIRCUITS

Filed July 28, 1954 3 Sheets-Sheet 3

INVENTOR
HARRY A. TOULMIN JR

BY Toulmin & Toulmin

ATTORNEYS

United States Patent Office 2,847,330

Patented Aug. 12, 1958

2,847,330

METHOD AND APPARATUS FOR GAS PLATING PRINTING CIRCUITS

Harry A. Toulmin, Jr., Dayton, Ohio, assignor to The Commonwealth Engineering Company of Ohio, Dayton, Ohio, a corporation of Ohio Application July 28, 1954, Serial No. 446,307

6 Claims. (Cl. 117—212)

The present invention relates to printed circuits, more particularly to the method and apparatus for making printed circuits and the like by gas plating.

A conventional printed circuit essentially comprises a non-conductor backing upon which there is a conductive pattern which forms an electric circuit. This conductive pattern may be a complete electric circuit in itself or may comprise a portion of an electric circuit. The pattern may consist of conductors and other circuit elements such as resistors, capacitors and inductances, each of which may be interconnected together in order to form an electric circuit. If desired, a plurality of printed circuits may be superimposed upon one another and interconnected at designated points in order to form more complex electric circuits.

The usual form of a printed circuit comprises a non-conductor backing which may be made of a plastic material and a metallic foil which is securely fastened to one face of the backing. Portions of the metallic foil are then removed by any one of a various number of processes and the parts of the metallic foil which remain form a predetermined conductive pattern. As this metallic foil is a very thin sheet of the order of several ten thousandths of an inch, it can be seen that a complete printed circuit will not occupy much more room than the thickness of a non-conductor backing which is usually of the order of one-sixteenth ($\frac{1}{16}$) of an inch. Consequently, a tremendous savings in space for electric circuits is achieved by the use of printed circuits. In addition, as the printed circuit comprises various circuit elements which are electrically connected together, the time of assembling the circuit elements by conventional methods such as soldering or the like is eliminated.

Recently there has been an increase in use in printed circuits. They are most commonly employed in electronic devices where space and weight is at a premium. In addition, printed circuits are being used in the manufacture of radio and television sets where the high production rates which are necessary to profitably manufacture these appliances make the use of printed circuits economical.

Heretofore the process of forming the conductive pattern has been largely a negative one in that portions of the metallic foil have been removed. This means that the basic product for a printed circuit must comprise a non-conductor backing having a metallic foil attached thereto.

In this invention a method and apparatus is disclosed for making printed circuits whereby the conductive pattern is made positively upon a non-conductor backing. The step of removing the metallic foil is, therefore, eliminated. This invention essentially comprises gas plating a non-conductor backing to form a conductive pattern.

The process of gas plating essentially comprises depositing metal from a gaseous metal compound. A surface upon which it is desired to deposit metal is heated to the heat of decomposition of the metal of the compound. When the gaseous compound contacts this heated surface the metal will continue to be deposited thereon during the period that the gas is in contact with the surface and as long as the surface is maintained at the temperature of decomposition of the metal. In this invention portions of a non-conductor backing are heated in the form of a predetermined conductive pattern. By bringing a non-conductor backing in contact with such a metal bearing gas, a thin coating of metal is deposited so as to form the conductive pattern thereon.

While this invention is particularly adapted for making printed circuits various modifications may be made therein for making other products. A modification of this invention which provides for making flexible matrices for rotary printing presses will also be described.

It is therefore the principal object of this invention to provide an improved method for the fast and accurate manufacture of printed circuits and the like.

It is another object of this invention to provide a method for making printed circuits by the gas plating process.

It is a further object of this invention to provide an economical and rapid method for making matrix plates for printing presses.

It is an additional object of this invention to provide a method for making flexible matrix plates for rotary printing presses by gas plating.

It is still another object of this invention to provide a method for making printed circuits by depositing metal on a non-conductor backing to form a predetermined conductive pattern.

It is still an additional object of this invention to provide an apparatus for making printed circuits by gas plating.

It is a still further object of this invention to provide an apparatus for making matrix plates for printing presses by gas plating.

Other objects and advantages of this invention will become apparent upon reference to the following description when taken in conjunction with the accompanying drawings wherein.

Figure 1:
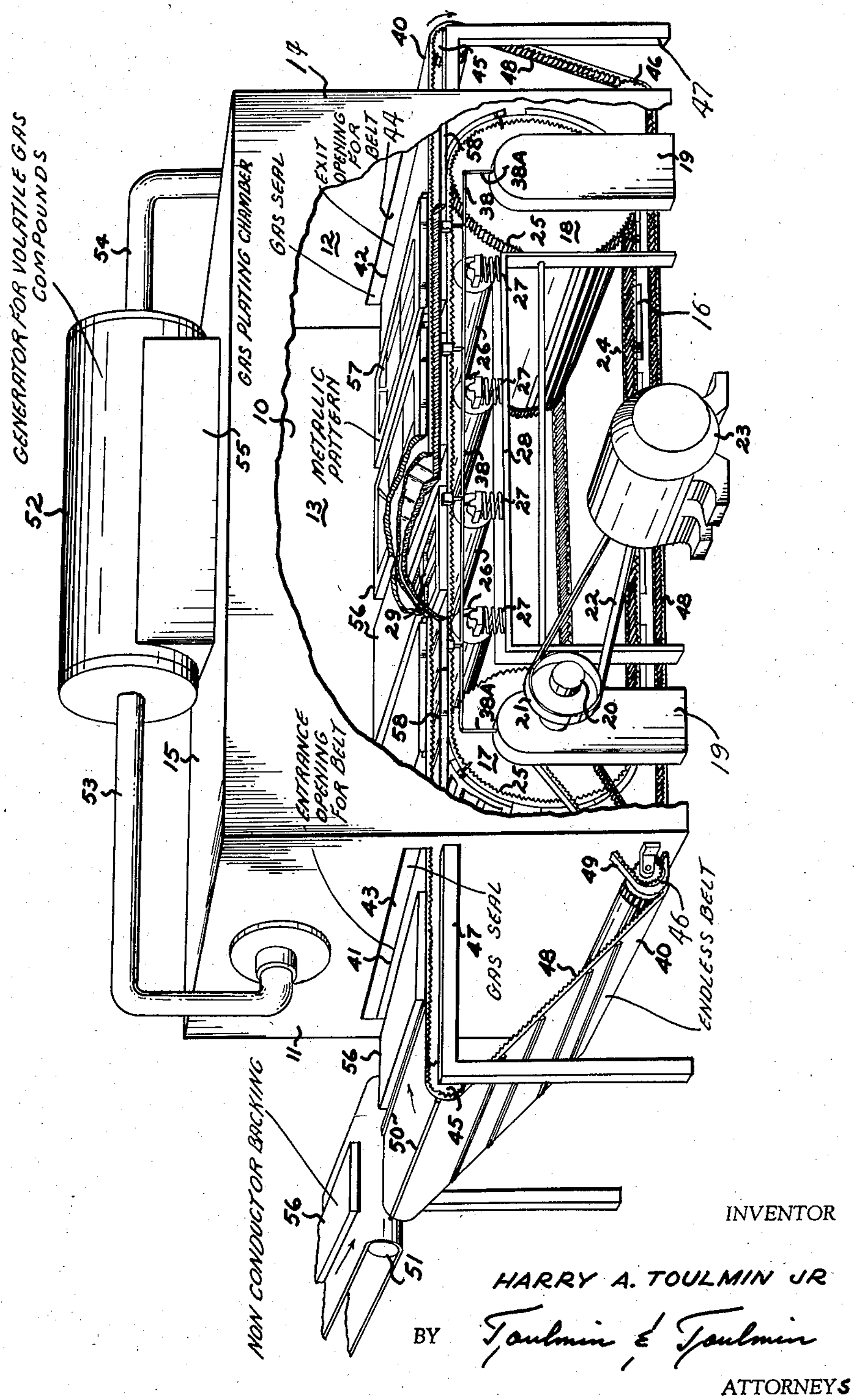
Fig. 1 is an over-all perspective view of the apparatus for making printed circuits with a portion of the chamber being removed in order to show interior details.

Returning now to the drawings, more particularly to Fig. 1 wherein like reference symbols indicate the same parts throughout the various views, Fig. 1 illustrates an apparatus for making printed circuits which apparatus comprises a chamber 10. The chamber 10 has end walls 11 and 12, side walls 13 and 14, and a top wall 15. As the volatile metal compounds which are to be introduced into the chamber 10 are toxic in nature, it is preferable that the chamber 10 be constructed so as to be air-tight.

Located completely within the chamber 10 is an endless belt 16 which is supported at each end thereof by the rotating drums 17 and 18. Each of the drums 17 and 18 is journalled in a pair of vertical mounting frames 19. Each of the vertical frames 19 are positioned within the chamber 10.

The rotating drum 17 is mounted upon a shaft 20 which extends beyond one of the mounting frames 19. There is a pulley 21 on the extended portion of the shaft 20. The pulley 21 is connected by means of a belt 22 to a suitable source of power which is in the form of an electric motor 23.

In order to insure positive driving action of the endless belt 16 by means of the rotating drums 17 and 18, each edge of the endless belt 16 has a line of teeth 24 which are adapted to positively engage teeth 25 on the peripheral edges of each of the rotating drums 17 and 18. If desired, any other arrangement may be employed in order to obtain positive driving action of the endless belt 16 by means of the rotating drums 17 and 18. The desirability of this positive drive of the endless belt will be explained later.

A plurality of rollers 26 are biased by means of springs 27 against the under surface of the endless belt 16 when it is moving along its upper horizontal path. The springs 27 are each mounted upon a bracket member 28 which extends upwardly from the bottom wall of the chamber 10.

A plurality of similarly shaped grids 29 are equally spaced along the endless belt 16. The typical construction which the grid 29 may take is shown in detail in Fig. 3. The grid 29 consists of conductive portions 30 with spaces 31 between the non-conductor portions. The conductive portions 30 form a conductive pattern which it is desired to print upon a non-conductor backing in order to form a printed circuit. The grid 29 is made of a metal which has high electrical resistance qualities so that when an electrical current is passed through the grid, will become quickly heated.

Figures 2, 3, 4, 5, 6:
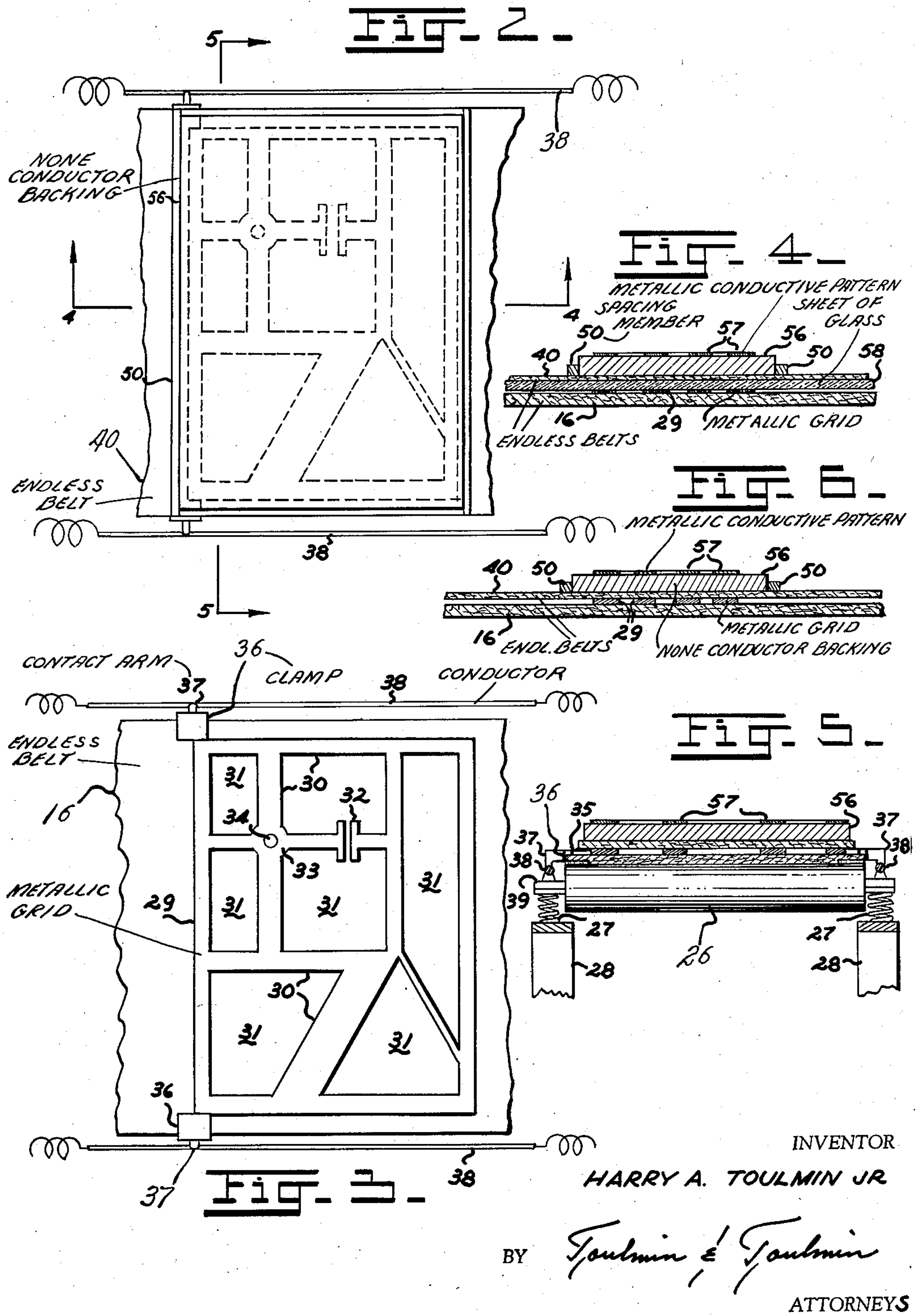
Fig. 2 is a plan view of a non-conductor backing positioned over a grid.
Fig. 3 is a plan view of a grid used in this apparatus.
Fig. 4 is a sectional view taken along the lines 4—4 of Fig. 2.
Fig. 5 is a sectional view taken along the lines 5—5 in Fig. 2.
Fig. 6 is a sectional view taken similarly to Fig. 4 but disclosing a modification of the apparatus.

The conductive portions 30 comprise several circuit elements. The example of a grid as illustrated in Fig. 3 shows the use of a capacitor 32 and also shows that the width of the conductive paths may be varied in order to vary the resistance of the various conductors. At 33 there is shown a circular junction where two conductive paths intersect. There is an opening 34 in the circular junction 33 in order to allow for the completed printed circuit to be interconnected with a printed circuit superimposed directly above it and similarly having an opening which corresponds to the opening 34.

On each end of the leading edge of the grid 29 there are projecting portions 35 to secure the grid 29 to the endless belt 16. A substantially U-shaped resilient clamp 36 is employed with one leg in contact with one of the projecting portions 35 and the other leg of the clamp 36 in contact with the undersurface of the endless belt 16. The leg of the clamp 36 which is in contact with the projecting portion 35 in order to completely cover the portion when the grid is clamped to the belt. As illustrated in Fig. 5 there is an arm 37 which extends outwardly from each of the clamps 36. The arm 37 is in the form of an electrical brush which is in sliding contact with a conductor 38 which is carried upon the journal boxes 39 in which the rollers 26 are journalled. It will be noted that the conductor 38 is positioned on each side of the endless belt 16. Leads 38A connect the conductors 38 to a suitable source of electrical energy. It is preferable that a means for regulating the electrical current flowing through the conductors 38 be provided. By regulating the current flowing through the conductors 38 the temperature to which the grids will be heated can be regulated. As indicated previously, the temperature of the grid will be such so as to result in portions of the non-conductor backing maintaining the temperature of the heat of decomposition of the metal in the gaseous metal compound.

The grids 29 may be made of a metallic material which is sufficiently flexible so as to easily bend when the endless belt 16 goes around each of the rotating drums 17 and 18. A flexible grid is depicted in Fig. 1. If desired, however, it is possible to make a grid from a substantially rigid material which will not flex. In this event the leading edge of the grid is clamped to the belt as shown in Fig. 3. When the grid is carried around each of the rotating drums 17 and 18 the grid will be tangential to the drum. With a rigid grid guide means may be provided spaced from each of the rotating drums and underneath the lower portion of the endless belt 16. These guides would prevent the rigid grids from falling away from the endless belt because of the weight of the grids. The material from which the grid is made will depend largely upon the final size of the printed circuit.

There is a second endless belt 40 which passes through the chamber 10. There are suitably sized openings 41 and 42 in the end walls 11 and 12 respectively to admit passage of the endless belt 40. Flexible sealing means 43 and 44 are mounted on each of the openings 41 and 42 to permit passage of the endless belt 40 therethrough but preventing the gases within the chamber 10 from leaking to the atmosphere through the openings 41 and 42. The endless belt 40 is carried by upper rollers 45 and lower rollers 46. Each of the upper rollers 45 is supported by means of a bracket 47, which bracket is attached to both the respective end wall of the chamber 10 and the floor upon which the chamber is mounted.

The endless belt 40 also has a line of teeth 48 on each edge thereof to engage cooperating teeth on both the upper and lower rollers. This also is to insure positive drive of the endless belts. A positive drive belt 49 interconnects the rotating drums 17 with one of the lower rollers 46. The gears on both the rotating drum 17 and the lower roller 46 which cooperates with the drive belt 49 are so selected that the endless belt 40 is driven at the same linear speed as the endless belt 16.

Suitable spacing members 50 are eually spaced upon the endless belt 40 so as to receive non-conductor backings therebetween. If desired, a suitable mechanism as indicated at 51 may be provided to automatically feed non-conductor backings on to the endless belt 40.

A generator 52 for generating volatile metal compounds is connected by means of conduits 53 and 54 to the end walls of 11 and 12 respectively. These compounds may comprise hydroxyls and carbonyls of various metals such as iron, nickel, zinc and the like. The generator 52 is supported above the chamber 10 by means of a supporting frame 55. With this arrangement it can be seen that the volatile metal compounds are passed through the conduit 53 into the chamber 10 and then returned to the generator 52 by means of a conduit 54. This gas plating apparatus and process are essentially similar to those disclosed in U. S. Patent 2,332,309.

In operation of this apparatus a succession of non-conductor backings 56 is fed upon the endless belt 40. The non-conductor backings 56 are placed on the belts between the spacing members 50 which are so positioned upon the endless belt 40 so as to divide the spaces between the members 50 into equal areas. Tracing the course of a single non-conductor backing, it can be seen that as the backing is carried into the chamber 10 it will be positioned directly over a grid 29 which is being carried by the endless belt 16. The grids 29 have been so spaced upon the endless belt 16 that a grid will automatically be positioned beneath each non-conductor backing as the backing moves through the chamber 10. Since both endless belts 16 and 40 move at the same linear speed, it can be seen that the relationship between a non-conductor backing and its respective grid will be unchanged throughout the progress of the backing through the chamber.

As the brush attached to each grid comes in contact with the conductor 38, the grid will become heated due to the passage of electric current therethrough. This heat will, in turn, be transmitted up through the underbelt 40 and through the non-conductor backing 56. As indicated in Fig. 6 it can be seen that the portions of the non-conductor backing 56 which are heated will correspond to the shape of the grid 29 therebeneath. As the heated portions of the non-conductor backing reach the heat of decomposition of the metal within the gaseous metallic compound, metal will begin to be deposited upon these heated portions. Consequently, when the non-conductor backing is carried out of the chamber 10, a metallic conductive pattern 57 will be formed thereon, which pattern will correspond to the grid. By varying the speed of the non-conductor backings to the chamber 10, the thickness of the conductive pattern 57 may be varied. The process by which the metal is deposited is indicated in U. S. Patent 2,332,309.

In some instances the conductive pattern may not be formed in the exact position on the backing as desired. In this event it may be necessary to trim the edges of the backing somewhat. Any suitable cutting apparatus may be used for this purpose.

It is pointed out that in the apparatus as described above, a sheet of glass 58 is positioned between the two endless belts 16 and 40. The purpose of the glass sheet 58 is to prevent any of the gaseous metal compound from adhering to any other portions of the apparatus which may be at the temperature of the heat of decomposition of the metal. This would be especially true of the sides of the grids 29. The glass sheet 58 is more clearly shown in Fig. 4. It is pointed out, however, that if desired the glass sheet may be eliminated as shown in Fig. 6 and in this event the rollers 26 serve to maintain the grids 29 in close contact with the under surface of the endless belt 40.

This apparatus has been described in connection with the rapid production of printed circuits by employing a plurality of grids. If desired, the same principles described in connection with this apparatus may be employed by utilizing a single grid which is brought into cooperating relationship underneath each non-conductor backing which is passed through the chamber 10.

Figure 7:
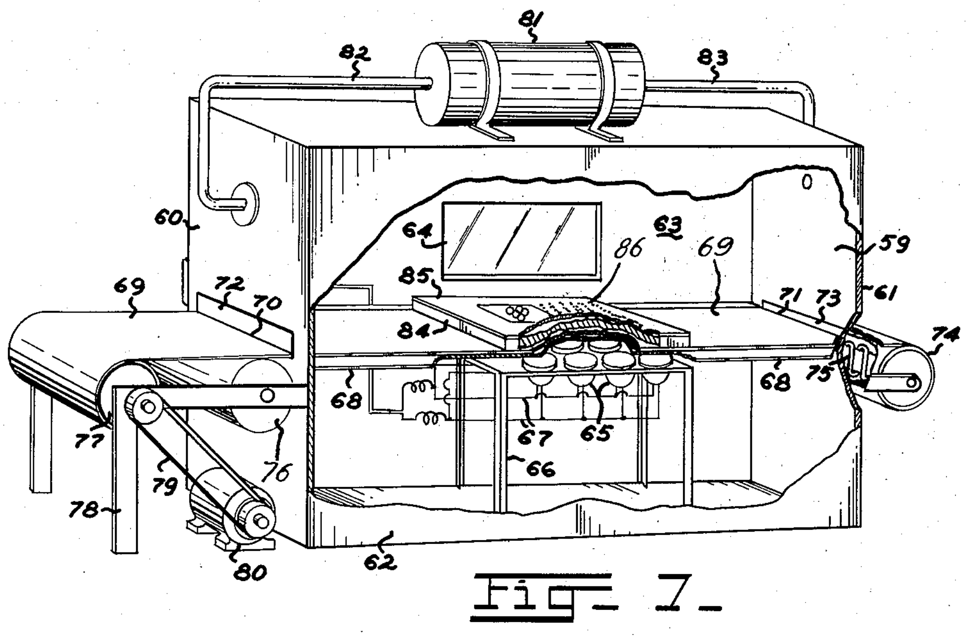
Fig. 7 is an over-all perspective view of a modified form of the apparatus for use in making matrices for printing presses.
Figure 8:
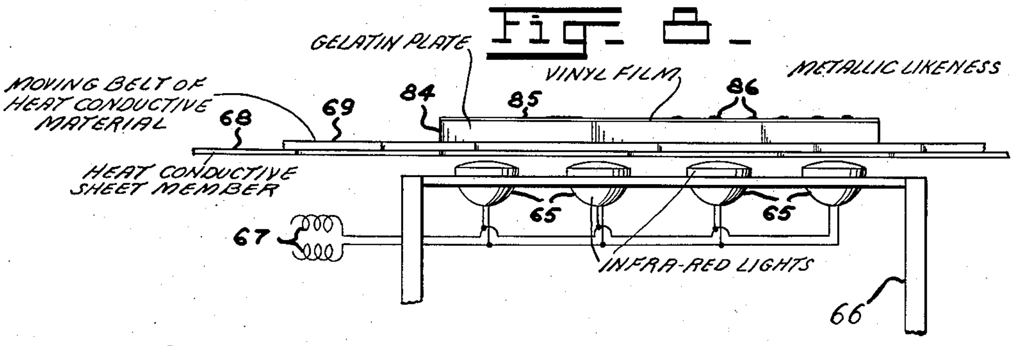
Fig. 8 is a sectional view taken along the lines 8—8 in Fig. 7.

A modification of this apparatus is disclosed in Fig. 7. This modification is especially adapted to the production of flexible matrices for rotary printing presses. This modification comprises a chamber 59 having end walls 60 and 61, and side walls 62 and 63. A glass window 64 is located in the side wall 63.

Positioned within the chamber 59 and spaced above the floor thereof is a battery of infra-red lights 65. The lights 65 are positioned as close together as possible in order to uniformly radiate heat over a considerable area. The lights 65 are supported by a frame 66 and are interconnected by electrical leads 67 which, in turn, are connected to a suitable source of electrical energy. A thin sheet-like member 68 is positioned immediately above the infra-red light 65 in order to prevent any of the volatile metal compound from adhering to the light surfaces. The sheet member 68 is readily heat conductive and may be made of aluminum or the like.

There is a belt 69 of considerable width which passes through openings 70 and 71 located in the end walls 60 and 61 respectively. Sealing means 72 and 73 are provided on each of the openings 70 and 71 respectively so as to prevent any of the gas within the chamber 59 from passing to the atmosphere. One end of the belt 69 is rolled about a roller 74 which is biased by a spring 75 in a clock-wise direction so as to tend to cause passage of the belt 69 toward the end wall 61. The other end of the belt 69 which passes through the opening 70 passes over a freely journalled roller 76 and is wound about a roller 77. Rollers 76 and 77 are supported in a frame 78 which is fastened to the end wall 60. A drive belt 79 connects the roller 77 with a reversible electric motor 80. The electric motor 80 is connected to a suitable set of controls so that the motor 80 may be quickly started and stopped or reversed. By running the electric motor 80 in such a direction as to cause rotation of the roller 77 in clock-wise direction, it can be seen that belt 69 is caused to pass into the chamber 59 due to the action of the spring 75. When it is desired to withdraw the belt from the chamber the motor is reversed so as to cause the roller 77 to rotate in the counter clock-wise direction.

A volatile metal compound generator 81, such as described in U. S. Patent 2,382,309, is connected by means of conduits 82 and 83 in the chamber 59. This provides a closed circuit for the volatile metal compound.

In operation, a photographic likeness is made upon a gelatin plate 84. This likeness may be of a pictorial representation, printing or a combination of the two. The gelatin plate 84 is then placed upon the belt 69 outwardly of the chamber adjacent the end wall 63. A film of vinyl 85 or any other suitable material is then positioned upon the gelatin plate upon the upper surface thereof which bears the photographic likeness. By operation of the electric motor 80 the plate and vinyl film are carried into the chamber 59 and positioned directly above the infra-red lights 65. The infra-red lights are then turned on and the light emanating therefrom passes through the aluminum sheet through the belt, gelatin plate and vinyl film to heat the upper surface of the vinyl film proportionately to the shading on the gelatin plate caused by the photographic likeness. A volatile metal compound is then introduced into the chamber and metal would become deposited upon the heated portions of the vinyl film in proportion to the heat of the different areas thereof. This will result in the photographic likeness being reproduced in metal 86 upon the upper surface of the vinyl film. This process of gas plating is described in U. S. Patent 2,332,309. As the vinyl film may be heated to the heat of decomposition of the metal within the volatile metal compound, it can be seen that the vinyl film may be readily gas plated.

Figure 9:
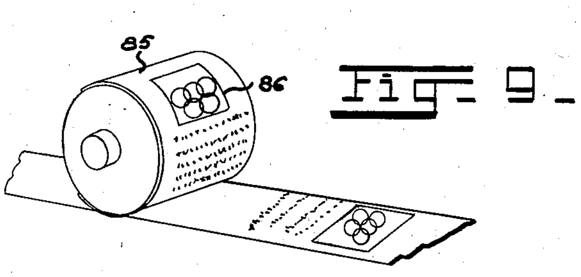
Fig. 9 is a schematic diagram showing an application of a flexible matrix made on the apparatus illustrated in Fig. 7.

As the vinyl film is flexible, the vinyl sheet bearing the metallic likeness thereon may be easily secured to a roller in a printing press, as indicated schematically in Fig. 9. Thus, the vinyl film with the gas plating thereon forms an inexpensive flexible matrix for printing presses.

The thickness of the metal deposited on the vinyl depends primarily upon the time which the heated vinyl is exposed to the gaseous metallic compound. It has been found that the length of the gas plating process will be anywhere from several seconds to 15 or 20 minutes, depending upon the thickness of the metallic coating desired. This would still appear to be a considerable saving of time over the conventional method of making matrices.

Thus it can be seen that the present invention discloses a method and apparatus for making printed circuits and matrices for printing presses by the gas plating process. In each application it can be seen that quick and accurate results may be obtained. In the making of printed circuits the metal is deposited positively thereon and the thickness of the deposited metal may be regulated in order to vary the resistances of the various conductor paths. In the modification of this apparatus, a flexible matrix may be readily made in a fraction of the time previously needed to make a matrix by conventional methods.

It will be understood that this invention is susceptible to modification in order to adapt it to different usages and conditions, and, accordingly, it is desired to comprehend such modifications within this invention as may fall within the scope of the appended claims.

What is claimed as this invention is:

1. In the method of making printed circuits by the deposition of metal from a gaseous metallic compound, forming a grid-like heating element in a predetermined conductive pattern, moving the heating element in a substantially straight line within a chamber while protecting the upper surface of the heating element from the chamber atmosphere, positioning a non-conductor backing immediately above the grid during the straight line movement thereof, passing an electric current through the element to heat the same to the decomposition temperature of the metal to be deposited, and introducing a gaseous metal compound into the chamber to enable the metal to be deposited on the heated portions of the backing to form a conductive pattern thereon.

2. In a method of making printed circuits by the deposition of metal from a gaseous metallic compound, forming a plurality of similarly shaped grids each in a predetermined conductive pattern, successively moving the grids in a chamber with a portion of the movement being in a horizontal path, passing a succession of non-conductor backings through the chamber, positioning each non-conductor backing immediately above a grid during the horizontal movement and removing the backing from the grid at the end of the horizontal movement, heating each grid during its horizontal movement to the decomposition temperature of the metal to be deposited, and depositing the metal from a gaseous metallicc compound on the heated portions of the non-conductor backing.

3. In the method of making printed circuits or the like by the deposition of metal from a gaseous metallic compound, the steps of controlling a source of heat to conform to a predetermined pattern, positioning a backing over the source of heat, heating areas of the upper surface of the backing from the source of heat to above the decomposition temperature of a selected metal while concurrently moving the backing and the source of heat, and exposing the upper surface of the backing to a gaseous compound of the selected metal to deposit the metal on the heated areas of the backing.

4. In the method of making printed circuits by the deposition of metal from a gaseous metallic compound, forming a grid in a predetermined conductive pattern, heating the grid to the decomposition temperature of the metal to be deposited, moving the heated grid through a chamber containing a gaseous metallic compound, positioning a non-conductor backing upon the grid to heat portions of the upper surface thereof without contact of the grid by the gaseous compounds, and depositing the metal from the gaseous metallic compound upon the heated portions.

5. In apparatus for making printed circuits by deposition of matter from a gaseous metallic compound, a chamber, means for moving a grid through said chamber, a portion of said grid movement being a straight line, means for conveying a backing into and out of said chamber and positioning said backing on the grid during the straight line movement, said conveying means protecting the upper surface of said grid from the chamber atmosphere, means for heating the grid to decomposition temperature of the metal to be deposited during the straight line movement to heat the upper surface of the backing, and means for depositing the metal from a gaseous metallic compound on the heated portions of the backing.

6. In the method of making printed circuits by the deposition of metal from a gaseous metallic compound, the steps of heating a grid having a predetermined pattern to the decomposition temperature of the metal to be deposited and protecting the upper surface of the grid from contact with gaseous metallic compounds, moving the heated grid through the atmosphere of the gaseous metallic compound, positioning a non-conductor backing upon the grid to heat portions of the upper surface thereof, and depositing the metal from a gaseous metallic compound upon the heated portions of the backing.

References Cited in the file of this patent

UNITED STATES PATENTS

| | | |
|---|---|---|
| 2,183,302 | Brauer | Dec. 12, 1939 |
| 2,332,309 | Drummond | Oct. 19, 1943 |
| 2,503,758 | Murray | Apr. 11, 1950 |
| 2,590,557 | Melsheimer | Mar. 25, 1952 |
| 2,638,423 | Davis | May 12, 1953 |

FOREIGN PATENTS

| | | |
|---|---|---|
| 306,902 | Great Britain | June 20, 1930 |